United States Patent
Kock et al.

(10) Patent No.: US 6,308,291 B1
(45) Date of Patent: Oct. 23, 2001

(54) METHOD FOR TESTING AN ELECTRONIC CIRCUIT

(75) Inventors: Ernst-Josef Kock, Kirchseeon; Peter Schneider, München, both of (DE)

(73) Assignee: Siemens Aktiengesellschaft AG, Munich (DE)

( * ) Notice: Subject to any disclaimer, the term of this patent is extended or adjusted under 35 U.S.C. 154(b) by 0 days.

(21) Appl. No.: 09/156,442

(22) Filed: Sep. 18, 1998

(30) Foreign Application Priority Data

Sep. 18, 1997 (DE) .............................................. 197 41 212

(51) Int. Cl.[7] .................................................... G01R 31/28
(52) U.S. Cl. ............................................................ 714/729
(58) Field of Search .................................... 714/724, 726, 714/729, 736

(56) References Cited

U.S. PATENT DOCUMENTS

| 5,271,019 | | 12/1993 | Edwards et al. | 714/727 |
|---|---|---|---|---|
| 5,349,587 | * | 9/1994 | Nadeau-dostie et al. | 714/729 |
| 5,365,528 | * | 11/1994 | Agrawal et al. | 714/736 |
| 5,617,427 | * | 4/1997 | Ohta et al. | 714/729 |
| 5,623,503 | * | 4/1997 | Rutkowski | 714/727 |
| 5,717,700 | * | 2/1998 | Crouch et al. | 714/726 |
| 5,761,215 | * | 6/1998 | Mccarthu et al. | 714/726 |
| 5,812,561 | * | 9/1998 | Giles et al. | 714/726 |
| 6,065,145 | * | 5/2000 | Bencivenga | 714/724 |

FOREIGN PATENT DOCUMENTS

| 262922A1 | 12/1988 | (DE) . |
|---|---|---|
| 3732830A1 | 4/1989 | (DE) . |
| 3835647A1 | 5/1989 | (DE) . |
| 0195164A1 | 9/1986 | (EP) . |
| 0 356 538 A1 | 3/1990 | (EP) . |

* cited by examiner

*Primary Examiner*—Albert Decady
*Assistant Examiner*—Shelly A Chase
(74) *Attorney, Agent, or Firm*—Herbert L. Lerner; Laurence A. Greenberg; Werner H. Stemer

(57) ABSTRACT

A method for testing an electronic circuit is described, in which the actual state of circuit components which have previously been activated on a test basis after an initial initialization is compared with a setpoint state. Of the circuit components to be tested, essentially only those circuit components are operated simultaneously which, under the given circumstances, can be expected to interact in the context.

12 Claims, 1 Drawing Sheet

METHOD FOR TESTING AN ELECTRONIC CIRCUIT

BACKGROUND OF THE INVENTION

FIELD OF THE INVENTION

The invention lies in the electronics field. More specifically, the invention relates to a method for testing an electronic circuit in which the actual state of circuit components which have previously been activated on a test basis after an initial initialization is compared with a setpoint state.

Such a method is, for example, the so-called scan method used in particular for testing integrated circuits.

Circuits that are enabled for testing in accordance with the scan method must be capable of being placed in a scan mode of operation in which selected circuit components, such as, for example, all the flip-flops of the circuit, are connected in such a way that they can be placed individually in specific initial states by means of a test device provided outside the circuit to be tested, and that their current state can, when necessary, be read out by the test device. This can be achieved when flip-flops are used as selected circuit components by virtue of the fact that the flip-flops are connected one behind the other in series in a scan mode of operation, the input terminal of a respective flip-flop being connected to the output terminal of the flip-flop located in front of it in series, and the output terminal of a respective flip-flop being connected to the input terminal of the flip-flop which comes after it in the series. Such an arrangement is also referred to as a scan chain.

Such a scan chain, to be more precise its elements formed by flip-flops in the example under consideration, can be initialized relatively easily. A signal applied to the input terminal of the first flip-flop of the scan chain, to be more precise the state of the relevant flip-flop which comes about in response thereto, is namely passed on from flip-flop to flip-flop with the clock of a clock signal applied to the flip-flops; with each clock pulse each flip-flop of the scan chain assumes the state of the flip-flop located in front of it in the scan chain.

If the $x^{th}$ flip-flop of the scan chain is placed in the state A, all that is necessary is "merely" to apply a signal to the input terminal of the first flip-flop of the scan chain. The signal places that flip-flop and the flip-flops connected downstream in the state A. Thereby, x clock pulses are applied to the scan chain (all the flip-flops of said chain).

Conversely, at the last flip-flop of the scan chain it is possible to read out the states of the individual flip-flops sequentially at a specific time.

If the scan chain contains n flip-flops, the circuit test is carried out according to the scan method as follows: firstly, the circuit is placed in the scan mode of operation, as a result of which the scan chain is formed. That scan chain is placed in a defined initial state by sequentially applying n input signals and n clock pulses. Then, the circuit is placed in a normal mode of operation; for this purpose the circuit is moved out of the scan mode of operation, the scan chain (the series connection of the flip-flops) is broken up. In the normal mode of operation, the circuit is briefly operated normally on a test basis. The time during which the circuit is operated normally is preferably defined by a number of clock cycles. This number of clock cycles is preferably very small (for example 1). In the time during which the circuit is operated normally, at least some of the states of the initially initialized flip-flops change, it being possible to determine from the way in which the circuit to be tested functions according to the regulations the (setpoint) state the flip-flops ought to be in at a respective time. After the circuit has operated normally for a predetermined number of clock cycles, it is returned to the scan mode of operation, as a result of which the flip-flops can be reconnected to form the scan chain. If the flip-flops which are connected in this way have clock signals applied to them in this state, data which represent the (actual) state of the flip-flops of the scan chain at the time when normal operation ends are pushed out sequentially at the end of the scan chain (from the output terminal of the last flip-flop of the scan chain) in time with the clock signals. If the actual state, determined as described, of the flip-flops of the scan chain is then compared with the known setpoint state of the chain, it is possible to determine whether or not the circuit to be tested is running without faults.

Tests that function in this way or similarly make it possible, in a relatively simple way, to test comprehensively even very complex circuits within a very short time. However, experience shows that under unfavorable conditions circuits which are functioning satisfactorily may be categorized as faulty. This is understandably a disadvantage which needs to be eliminated.

SUMMARY OF THE INVENTION

It is accordingly an object of the invention to provide a method of testing electronic circuits, which overcomes the above-mentioned disadvantages of the heretofore-known devices and methods of this general type and which enables dependable testing which avoids incorrect fault detection, i.e. which assures that only faulty circuits are categorized as faulty.

With the foregoing and other objects in view there is provided, in accordance with the invention, a method of testing an electronic circuit, which comprises:

initializing a number of circuit components;

simultaneously activating essentially only those circuit components on a test basis of which interaction is expected in a given context; and reading out an actual state of the circuit components to be tested, and comparing the actual state of the circuit components with a setpoint state.

Interaction, according to the design of the circuit, of cooperating circuit components, which may be, for example, the flip-flops but also other and/or more extensive components of the circuit to be tested is not to be expected, inter alia, when the clock signals with which the individual circuit components are to be clocked have an excessively large offset from one another or clock skew when operating on a test basis during the circuit test. This is as a rule particularly pronounced when the clock signals are produced by means of various clock signal generators.

These and other inadequacies in the interaction of circuit components can be avoided if circuit components which do not interact, or possibly do not interact, in accordance with the circuit design in the case of the activation of the circuit on a test basis when it is being tested are not activated simultaneously.

The circuit components which are not activated are preferably simply not supplied with clock signals.

During such partial operation of the circuit, precisely reproducible results (circuit component states) are always obtained; this reliably excludes the possibility of the states of the circuit components (the elements of a scan chain) which are of interest and on which the evaluation of the test is based being able to vary due to random factors.

The fact that specific circuit components do not interact according to the regulations during the circuit test cannot be interpreted as meaning that the circuit is faulty; it is merely the particular circumstances of the activation of the circuit on a test basis, in particular the extraordinary and only extremely brief activation which causes specific circuit components to interact in a way which is not according to the circuit layout prescriptions.

The comparison of the setpoint states of the circuit components which are activated and of the actual states of the components consequently allows the following conclusions to be drawn regarding the freedom from faults or faultiness of the circuit to be tested, with a degree of probability which borders on certainty. In particular, the possibility of circuits which are operating free of faults being categorized as faulty is essentially excluded.

In other words, of the circuit components to be tested, essentially only in each case those circuit components are operated simultaneously which, under the given circumstances, are expected to interact in the context of the given circuit.

In accordance with an added feature of the invention, the initializing and determining steps comprise placing the circuit to be tested in a scan mode of operation in which elements whose state is to be initialized and read out are connected one behind the other to form one or more scan chains.

In accordance with an additional feature of the invention, elements are assigned to various scan chains and a sequence is defined within a given scan chain such that clock signals with which the scan chain elements are clocked reach the scan chain elements during the activating step no later than at a time at which signals are to be received and/or transmitted by the respective scan chain element.

In accordance with another feature of the invention, the circuit to be tested comprises a plurality of flip-flops and the method further comprises using at least some of the flip-flops of the circuit as scan chain elements.

In accordance with a further feature of the invention, a specific test clock signal is used as the clock signal for initializing, for actuating on a test basis, and for reading out the states of the circuit to be tested.

In accordance with again an added feature of the invention, no clock signals are supplied to those parts of the circuit which, at the time, are not to be initialized, activated on a test basis, or read out.

In accordance with again an additional feature of the invention, circuit components to be selectively activated and deactivated are chosen from all elements of one or more scan chains. Alternatively, selected components of one or more scan chains are chosen as circuit components to be selectively activated and deactivated.

In accordance with again another feature of the invention, an application of a normal clock signal, a test clock signal, or no clock signal to said given circuit components is made dependent on contents of given registers assigned to the circuit components and on a status of a mode-of-operation-selection signal.

In accordance with again a further feature of the invention, the testing steps are repeated during a plurality of test runs and different circuit components are at least partly activated during each test run.

In accordance with yet a further feature of the invention, a number is set for the test runs such that ultimately each of the circuit components to be tested has been activated at least once alone or together with other circuit components. This assures that all testable circuit components are subjected to at least one test run.

In accordance with yet an added feature of the invention, all circuit components to be tested are placed into identical initial states before each test run.

In accordance with a concomitant feature of the invention, the contents of the register are set as a function of circuit-specific presettings and a number of a respective test run.

Other features which are considered as characteristic for the invention are set forth in the appended claims.

Although the invention is illustrated and described herein as embodied in a method for testing an electronic circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

DESCRIPTION OF THE PREFERRED EMBODIMENTS

Figure 1:
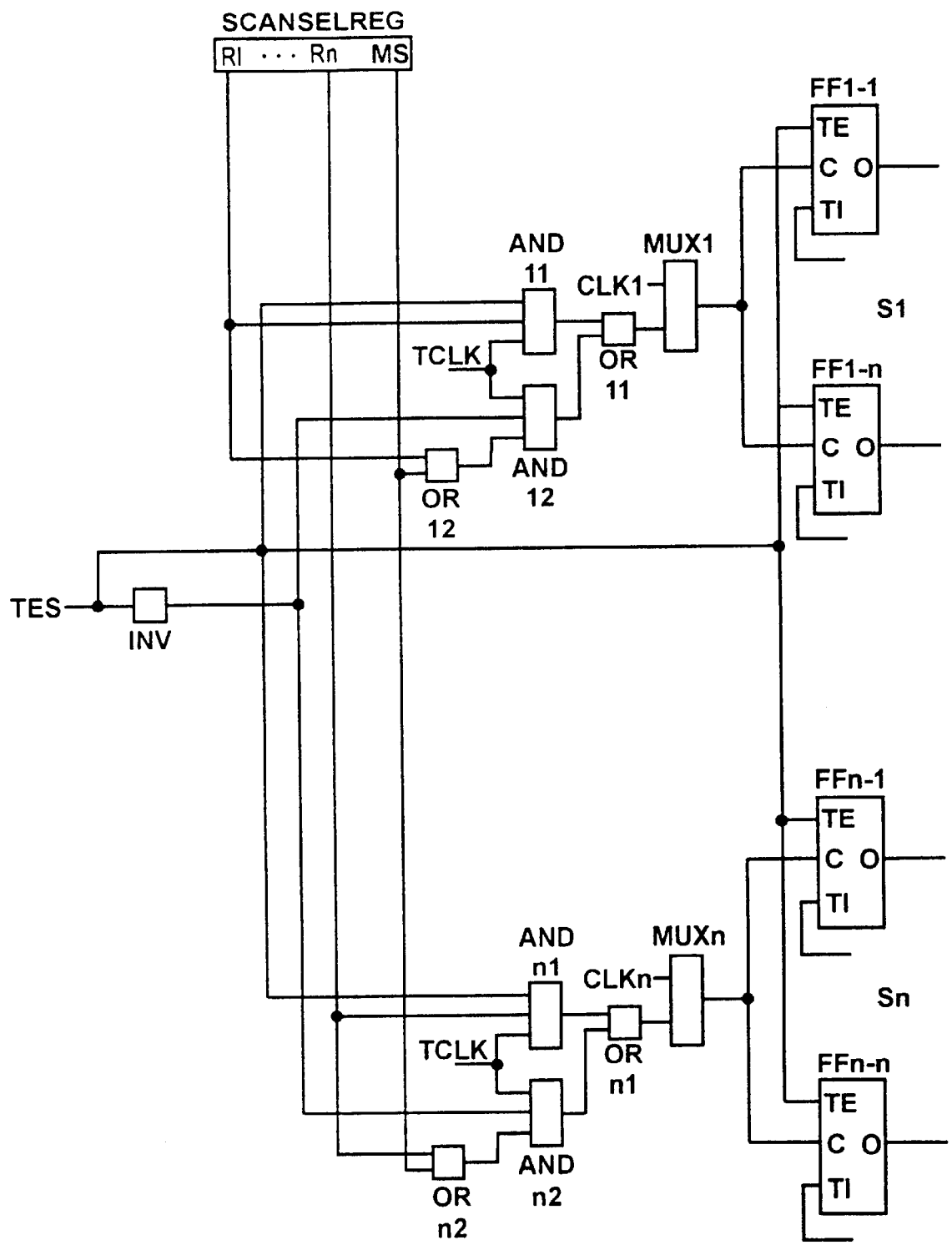
FIG. 1 is a circuit schematic showing the layout of a circuit configured in such a way that, when necessary, only specific circuit components are selectively activated.

The circuit that is to be tested by means of the method described in more detail below and the device described in more detail below is an integrated logic circuit. However, the method and the device can also be used to test nonintegrated circuits and/or circuits other than logic circuits.

The method and the device are used in particular to test the circuits at the manufacturer's premises before they are shipped. Nevertheless, the method and the device can also be used for any desired form of testing which is to be carried out later and elsewhere.

The method for testing the circuit is a scan method, and the elements of the scan chain are the flip-flops of the circuit. However, circuit components other than flip-flops can also be used as elements of the scan chain.

The circuit test takes place in four stages, namely:
1) the flip-flops (or the other circuit components) are placed in a specific initial state;
2) the circuit is briefly activated on a test basis;
3) the states of the flip-flops are read out; and
4) the actual states of the flip-flops are compared with their setpoint states.

The test, therefore, corresponds in broad respect with the scan method described at the beginning.

In order to carry out stage 1, the circuit to be tested is placed in a scan mode of operation in which the flip-flops are connected one behind the other in one or more scan chains.

Providing a plurality of scan chains proves advantageous because it permits simpler, more reliable and faster initialization of the scan chain elements. Satisfactory initialization of a respective scan chain namely requires, inter alia, the clock pulses by which the respective scan chain elements are clocked to reach the respective scan chain elements within predetermined time periods. Otherwise, the times at which the scan chain elements are ready to receive data may not correspond with the times at which new data are applied to the relevant scan chain elements, and/or the times at which the scan chain elements output changed data may not correspond with the times at which the scan chain element receiving this data is ready to receive data. This is not ensured, in particular, if the propagation times of the clock pulses from the clock generator to the scan chain elements are of different lengths or if the clock pulses are produced by a plurality of clock generators which cannot be triggered precisely simultaneously and/or operated in synchronism or if the signals which are to be transmitted between scan chain elements which are connected one behind the other have unusually long or short propagation times. If the flip-flops of the circuit to be tested are, on the other hand, assigned to a plurality of scan chains and if care is taken during the assignment of the scan chain elements to the respective scan chains and/or during the definition of the sequence within the scan chain that all the elements of a respective scan chain are clocked satisfactorily, it is possible to reliably ensure that all the scan chain elements can be initialized as desired. The clock pulses by which the scan chain elements are clocked can also be specific test clock pulses. In this case also, the provision of a plurality of scan chains proves advantageous because, here too, in particular due to propagation times, it is not ensured that the scan chain elements are ready to receive and output data precisely when it is expected of them. Each of the plurality of scan chains is loaded independently. Scan chains that have already been loaded (initialized) must no longer have clock pulses applied to them after the loading because as a result they would have to be unloaded or reloaded again. The number of elements per scan chain is not subject to any restrictions. The scan chains can be as long as desired independently of one another.

After the initialization of the scan chain elements in step 1, the circuit to be tested is made to leave the scan mode of operation. As a result, the connection of the scan chain elements one behind the other is eliminated and the circuit can be operated normally on a test basis. The normal operation on a test basis differs considerably from the conventional test method. To be precise the entire circuit, for example, is not operated at once but rather in each case only a selected part thereof. In addition, but completely independently of this, a specific test clock signal is used at least to clock the scan chain elements.

The circuit components which are each activated simultaneously are, or contain, in each case only those scan chain elements which interact satisfactorily (are ready to receive data when data arrive and output data when the receiver is ready to receive). This procedure makes it possible to reliably predict the respective current state of the scan chain elements, as a result of which the comparison, carried out in step 4, of the actual state determined in step 3 of the scan chain elements with a theoretically or empirically determined setpoint state permits a reliable statement to be made relating to the faultiness or freedom from error of the circuit to be tested. Steps 3 and 4 can be carried out particularly easily and quickly if the circuit components activated simultaneously each contain all the elements of one or more scan chains.

Referring now to the figure of the drawing FIG. 1, in detail the design of a possible configuration for activating selected circuit components on a test basis is illustrated in the figure. As is clear from the explanations below, the arrangement shown can also be used to initialize the scan chain elements (step 1 of the circuit test) and to read out the current states of the elements (step 3 of the circuit test); however, the description only touches on this.

The configuration illustrated in the figure shows only a few scan chain elements of the circuit to be tested, more precisely flip-flops FF1-1 to FF1-n of a first scan chain S1 and flip-flops FFn-1 to FFn-n of an $n^{th}$ scan chain Sn. Each of the flip-flops has a clock-signal input terminal C, a mode-of-operation-selection terminal TE, a test input terminal TI, a (non-illustrated) normal input terminal and an output terminal O. The clock-signal input terminals C of the flip-flops of a respective scan chain are each connected to the output terminal of a multiplexer MUX. That is to say the clock-signal input terminals C of the flip-flops FF1-1 to FF1-n of the first scan chain S1 are connected to the multiplexer MUX1, and the clock-signal input terminals C of the flip-flops FFn-1 to FFn-n of the $n^{th}$ scan chain Sn are connected to the multiplexer MUXn. The multiplexers have two input terminals, the same clock signal with which the respective flip-flops are clocked during the normal operation (CLK1 for MUX1 and CLKn for MUXn) being applied to one of the input terminals, and in each case a logic circuit comprising two AND elements AND11 and AND12 or ANDn1 and ANDn2 and two OR elements OR11 and OR12 or ORn1 and ORn2 being connected upstream of the respective other one of the input terminals of the multiplexers. The logic circuit has applied to it a mode-of-operation-selection signal TES, with the contents of a scan chain selection register SCANSELREG (with the contents of register elements R1 to Rn and MS) and a test clock signal TCLK.

The mode-of-operation-selection signal TES is active if, and for as long as, the steps 1 and 3 of the circuit test are being carried out. It is inactive if, and for as long as, the step 2 of the circuit test is being carried out. The mode-of-operation-selection signal TES is also available in an inverted form, the inversion being brought about by means of an inverter INV.

The contents of the register element MS have a high level if all the circuit components are to be activated simultaneously when the circuit to be tested is activated on a test basis. The contents have a low level if only selected circuit components are to be activated simultaneously.

The register elements R1 to Rn, from which in each case one of a specific scan chain, to be more precise the element R1 of the scan chain S1, an element R2 of a scan chain S2, . . . , and the element Rn of the scan chain Sn is assigned, define (given a low level of the register element MS) which of the circuit components of the circuit to be tested are operated simultaneously in the case of activation on a test basis.

The circuit to be tested is placed in a scan mode of operation by the mode-of-operation-selection signal TES. The placing of the circuit in the scan mode of operation (in order to carry out steps 1 and 3 of the circuit test), that the flip-flops FF1-1 to FFn-n use in each case the test input signal terminal TI as input terminal (switch off or ignore the normal input terminal), as a result of which the flip-flops of the respective scan chains are connected one behind the other in series. On the other hand, the normal clock signals CLK1 or CLKn are no longer connected through by the respective multiplexers to the clock signal input terminals C of the flip-flops but instead the respective output signals of the logic circuits connected upstream of the other multiplexer input terminals. This is, by the way, also the case when the circuit to be tested is activated on a test basis in step 2 of the circuit test.

The respective logic circuits connect through the test clock signal TCLK to the second multiplexer input terminal if either the mode-of-operation-selection signal TES is active and the register element Rx, assigned to the relevant scan chain, of the scan chain selection register SCANSEL-REG has a high level; or the mode-of-operation-selection signal TES is inactive and the register element MS and/or the register element Rx, assigned to the relevant scan chain, of the scan chain selection register SCANSELREG has a high level.

In all other cases, the test clock signal TCLK is not connected through.

From the explanations above it is clear that the scan chain selection register SCANSELREG defines whether a complete or only partial activation on a test basis of the circuit to be tested is to take place, and which circuit components are to be activated in the case of an only partial activation of the circuit at a respective time.

Which of the circuit components can be activated simultaneously at a respective time is preferably defined in accordance with the way the circuit to be tested has been laid out, taking into account the expected clock skew and the expected data propagation times between the scan chain elements. In each case only those scan chain elements at which the clock skew between the individual clock pulses is smaller than the shortest signal propagation time between two scan chain elements are activated simultaneously on a test basis. The definition of circuit components which are to be activated simultaneously can, as an alternative or in addition, also be made taking into account other conditions. The "only" important factor is that the circuit components interact satisfactorily under the given conditions (test conditions). The scan chain elements which are activated simultaneously in the case of the example under consideration are in each case all the elements of one or more scan chains. That is to say the scan chain elements are activated in units of one or more scan chains. However, given appropriate modification of the arrangement shown in the figure any desired selection of elements of any desired scan chains may also be activated together.

After selected circuit components of the circuit to be tested have been briefly activated on a test basis in step 2 of the circuit test (for the duration of one clock pulse in the example under consideration), the circuit to be tested is returned to the scan mode of operation (by activating the mode-of-operation-selection signal TES) in order to carry out step 3 of the circuit test. As a result, the scan chain elements are reconnected to form the scan chains. This makes it possible to read out the respective states of the scan chain elements. To do this, the scan chains, more precisely the elements of a respective scan chain, merely need to be clocked as for the initialization of the scan chain. This alone is sufficient to push out the states of the respective scan chain elements, or data or signals representing the elements, sequentially at the (rear) end of the relevant scan chain.

Usually, it will probably be most important to read out those scan chains from which individual elements or all the elements have previously been activated on a test basis in step 2. However, it is also possible to read out and subject to comparison in step 4 of the circuit test those scan chains whose elements may not have changed in status because they have not been activated in the meantime.

Simultaneously with the reading out of the states of the scan chain elements, those elements can also be newly initialized as in step 1. This proves advantageous because, given only partial activation on a test basis of the circuit to be tested, steps 1 to 4 of the circuit test have to be repeated until all the circuit components have been activated on a test basis at least once, thus enabling them to be subjected to testing.

The actual states, read out in step 3 of the circuit test, of the scan chain elements are subjected to a comparison with known setpoint states in step 4.

If the actual states correspond to the setpoint states, it can be assumed that the circuit components subjected to testing (in particular the circuit components which have been activated on a test basis in step 2) have passed the relevant test run without faults; otherwise, i.e. if there are discrepancies between the actual states and the setpoint states, it can be assumed that the circuit is faulty.

When the steps 1 to 4 have been processed, a run of the circuit test is terminated. If all the circuit components have not yet been tested, steps 1 to 4 or 2 to 4 are repeated for the circuit components which have not yet been tested. The contents of the scan chain selection register SCANSELREG need to have been modified beforehand, specifically in such a way that at least some circuit components which have not yet been tested are tested during the next run.

In the method described, only those circuit components which can interact satisfactorily under the prevailing test conditions are ever tested together. This reduces to a minimum the risk of categorizing as faulty a circuit which has been constructed to be free of faults and operates free of faults.

The fact that the circuit to be tested is activated in each case only partially on a test basis (step 2 of the described method) proves advantageous even if the circuit components are initialized differently than in step 1 and/or their states are read out differently than in step 3. In particular, it is not an absolute precondition that the relevant elements be connected in series to form chains for this purpose; instead, there may, for example, be provision for the individual elements to be addressed directly in order to load and unload them (for example via a parallel register transfer).

The fact that the circuit to be tested is activated in each case only on a partial basis also proves advantageous in that the initial states into which the individual circuit components are to be placed at the start of the test or before each test run (the so-called test patterns) can be devised without taking into account a clock skew which may possibly be present in the circuit to be tested, because the skew can, of course, be limited to a negligible or tolerable extent if the circuit to be tested is activated only partially. The process of devising the test patterns thus becomes considerably easier and is less prone to faults than was previously the case.

We claim:

1. A method of testing an electronic circuit, which comprises:
   initializing a number of circuit components;
   simultaneously activating essentially only those circuit components on a test basis of which interaction is expected in a given context; and
   reading out an actual state of the circuit components to be tested, and comparing the actual state of the circuit components with a setpoint state.

2. The method according to claim 1, wherein the circuit to be tested comprises a plurality of flip-flops and the method further comprises using at least some of the flip-flops of the circuit as scan chain elements.

3. The method according to claim 1, which comprises using a specific test clock signal as clock signal for initializing, for actuating on a test basis, and for reading out the states of the circuit to be tested.

4. The method according to claim 1, which comprises defining circuit components to be selectively activated and deactivated in each case all elements of one or more scan chains.

5. The method according to claim 1, which comprises defining selected components of one or more scan chains as circuit components to be selectively activated and deactivated.

6. The method according to claim 1, which comprises repeating the initializing, activating, and reading steps during a plurality of test runs and at least partly activating different circuit components during each test run.

7. The method according to claim 6, which comprises defining a number of test runs such that ultimately each of the circuit components to be tested has been activated at least once alone or together with other circuit components.

8. The method according to claim 7, which comprises placing all circuit components to be tested into identical initial states before each test run.

9. The method according to claim 1, which comprises changing the contents of the register as a function of circuit-specific presettings and a number of a respective test run.

10. A method of testing an electronic circuit, which comprises:

initializing a number of circuit components;

in the initialization step, placing a circuit to be tested in a scan mode of operation in which elements whose state is to be initialized and read out are connected one behind the other to form one or more scan chains;

assigning elements to various scan chains and defining a sequence within a given scan chain such that clock signals with which the scan chain elements are clocked reach the scan chain elements during the activating step no later than at a time at which signals are to be one of received and transmitted by the respective scan chain element;

simultaneously activating essentially only those circuit components on a test basis of which interaction is expected in a given context; and reading out an actual state of the circuit components to be tested, and comparing the actual state of the circuit components with a setpoint state.

11. A method of testing an electronic circuit, which comprises:

initializing a number of circuit components;

simultaneously activating essentially only those circuit components on a test basis of which interaction is expected in a given context;

reading out an actual state of the circuit components to be tested, and comparing the actual state of the circuit components with a setpoint state; and supplying no clock signals to those parts of the circuit which, at the time, are not to be initialized, activated on a test basis, or read out.

12. A method of testing an electronic circuit, which comprises:

initializing a number of circuit components;

simultaneously activating essentially only those circuit components on a test basis of which interaction is expected in a given context;

reading out an actual state of the circuit components to be tested, and comparing the actual state of the circuit components with a setpoint state; and assigning registers to given circuit components, and making an application of a normal clock signal, a test clock signal, or no clock signal to said given circuit components dependent on contents of the given registers assigned to the circuit components and on a status of a mode-of-operation-selection signal.

* * * * *